(12) United States Patent
Kouvetakis et al.

(10) Patent No.: US 7,915,104 B1
(45) Date of Patent: Mar. 29, 2011

(54) METHODS AND COMPOSITIONS FOR PREPARING TENSILE STRAINED GE ON $GE_{1-y}SN_y$ BUFFERED SEMICONDUCTOR SUBSTRATES

(75) Inventors: John Kouvetakis, Mesa, AZ (US); Yan-Yan Fang, Tempe, AZ (US)

(73) Assignee: The Arizona Board of Regents, a body corporate of the state of Arizona acting for and on behalf of Arizona State University, Scottsdale, AZ (US)

( * ) Notice: Subject to any disclaimer, the term of this patent is extended or adjusted under 35 U.S.C. 154(b) by 462 days.

(21) Appl. No.: 12/133,221

(22) Filed: Jun. 4, 2008

Related U.S. Application Data

(60) Provisional application No. 60/933,013, filed on Jun. 4, 2007.

(51) Int. Cl.
| H01L 21/00 | (2006.01) |
| H01L 21/338 | (2006.01) |
| H01L 21/336 | (2006.01) |
| H01L 21/20 | (2006.01) |
| H01L 21/36 | (2006.01) |

(52) U.S. Cl. ............ 438/172; 438/22; 438/57; 438/285; 438/479; 257/E21.116

(58) Field of Classification Search ............ 438/479, 438/285, 57, 22, 172; 257/E21.116
See application file for complete search history.

(56) References Cited

U.S. PATENT DOCUMENTS

| 2,988,427 | A | 6/1961 | Jenker et al. |
| 4,777,023 | A | 10/1988 | Fieselmann et al. |
| 4,910,153 | A | 3/1990 | Dicksen et al. |
| 7,238,596 | B2 | 7/2007 | Kouvetakis et al. |
| 7,589,003 | B2 | 9/2009 | Kouvetakis et al. |
| 7,594,967 | B2 | 9/2009 | Vineis et al. |
| 7,598,513 | B2 | 10/2009 | Kouvetakis et al. |
| 2005/0040411 | A1* | 2/2005 | Wada et al. ............ 257/79 |
| 2007/0105251 | A1* | 5/2007 | Liu et al. ............ 438/22 |
| 2007/0297967 | A1 | 12/2007 | Kouvetakis et al. |
| 2008/0113186 | A1 | 5/2008 | Kouvetakis et al. |
| 2009/0050935 | A1 | 2/2009 | Kouvetakis et al. |
| 2010/0012972 | A1 | 1/2010 | Kouvetakis et al. |

FOREIGN PATENT DOCUMENTS

DE      4306106 A1    9/1994

(Continued)

OTHER PUBLICATIONS

Takeuchi (2007) Semicond Sci Technol, 22:S231-S235.

(Continued)

*Primary Examiner* — Alexander G Ghyka
*Assistant Examiner* — Seahvosh J Nikmanesh
(74) *Attorney, Agent, or Firm* — McDonnell Boehnen Hulbert & Berghoff LLP

(57) ABSTRACT

The present disclosure describes methods for preparing semiconductor structures, comprising forming a $Ge_{1-y}Sn_y$ buffer layer on a semiconductor substrate and forming a tensile strained Ge layer on the $Ge_{1-y}Sn_y$ buffer layer using an admixture of $(GeH_3)_2CH_2$ and $Ge_2H_6$ in a ratio of between 1:10 and 1:30. The disclosure further provides semiconductor structures having highly strained Ge epilayers (e.g., between about 0.15% and 0.45%) as well as compositions comprising an admixture of $(GeH_3)_2CH_2$ and $Ge_2H_6$ in a ratio of between about 1:10 and 1:30. The methods herein provide, and the semiconductor structure provide, Ge epilayers having high strain levels which can be useful in semiconductor devices for example, in optical fiber communications devices.

21 Claims, 13 Drawing Sheets

FOREIGN PATENT DOCUMENTS

| | | |
|---|---|---|
| EP | 0430280 A | 6/1991 |
| WO | 2004036631 | 4/2004 |
| WO | 2006031240 | 3/2006 |
| WO | 2006031257 | 3/2006 |
| WO | 2007062096 | 5/2007 |

OTHER PUBLICATIONS

Soref (1993) Proceedings of IEEE, 81(12):1687-1706.
Soref (1996) J Vac Sci Technol, A 14(3): 913-918.
Soref (1993) Superlattices and Microstructures 14(2/3):189-193.
Green (2001) Prog Photovolt Res Appl 9:123-135.
Jalali (2006) IEEE Microwave Magazine 58-68.
Morrison (2005) Power Electronics Technology, 44- 46.
Wietler (2006) Thin Solid Films 508:6-9.
Reiffel (1955) Physical Review 97(6):1714-1716.
Bills (1964) J Phys Chem 68(4):806-810.
Schwarz-Selinger (2002) Physical Review B 65:125317-1.
Kelly (2006) Appl. Phys. Lett., 88, 152101.
Kelly (2007) Semicond. Sci. Technol. 22, S204-S207.
Shang (2006) IBM Journal of Research and Development 50 (4/5): 377-386.
Anastassakis (1990) Physical Review B 41(11): 7529-7535.
De Jaeger (2005) Microelectronic Engineering 80: 26-29.
Nakashima (2006) J Appl Phys 99:053512.
Anastassakis (1993) Solid State Communications 88(11/12):1053-1058.
Cerderia (1972) Physical Review B 5(2):580-593.
Fitzgerald (1997), Thin Solid Films, 294: 3-10.
Wietler (2005) App Phys Lett 87:182102.
Jutzi (2005) IEEE Photonics Technol Lett 17(7):1510-1512.
Kuo (2005) Nature 437: 1334-1336.
Lee (2005) J Appl Phys 97:011101.
Bauer (2003) Solid State Communications 127:355-359.
Cannon (2004) Appl Phys Lett 84(6): 906-908.
Ishikawa (2003) Appl Phys Lett 82(13):2044-2046.
Liu (2004) Physical Review B 70:155309.
Liu (2005) Appl. Phys. Lett. 87:103501.
Oh (2002) IEEE J. Quantum Electron 38(9):1238.
Cook (2004) Thin Solid Films 455-456:217-221.
Costa (2007) Physical Review B 76:035211.
Kouvetakis (2007) J Mater Chem 17:1649-1655.
Roucka (2007) J Appl Phys 101:013518.
Tice (2007) J Am Chem Soc 129(25): 7950-7960.
Bauer (2003) Appl Phys Lett 83(17):3489-3491.
Menendez (2004) Appl Phys Lett 85(7):1175-1177.
Roucka (2005) Appl Phys Lett 86:191912.
D'Costa (2006) Physical Review B 73:125207.
Aella (2004) Appl Phys Lett 84(6):888-890.
Bauer (2002) Appl Phys Lett 81(16):2992-2994.
Bauer (2003) Appl Phys Lett 83(11):2163-2165.
Kouvetakis (2006) Annu Rev Mater Res. 36:497-554.
Wistey (2007) Appl Phys Lett 90:082108.
Fang (2007) Chem Mater 19(24):5910-5925.
Fang (2007) Appl Phys Lett 90: 061915.
Luan (1999) Appl. Phys. Lett. 75: 2909.
Currie (1998) Appl. Phys. Lett. 72: 1718.
Fitzgerald, (1992) J. Vac. Sci. Technol. B 10: 1807.
Stirman (2004) Appl. Phys. Lett. 84: 2530.
Cunningham (1991) Appl. Phys. Lett. 59: 3574.

Tolle (2006) Appl. Phys. Lett. 88, 252112.
Hu C-W et al., "Low-temperature pathways to Ge-rich Si1-xGex alloys via single-source hydride chemistry" , Applied Physics Letters, AIP, American Institute of Physics, vol. 87, No. 18, pp. 181903, 2005.
Ritter C J et al., "Synthesis and Fundamental Studies of (H2Ge)xSiH4-x Molecules: Precursors to Semiconductor Hetero- and Nanostructures on Si", Journal of the American Chemical Society, vol. 127, pp. 9855-9864, 2005.
Hu Changwu et al., "Synthesis of Si-Ge nanoscale structures via deposition of single-source (GeH3)4-nSiHn hydrides", Applied Physics Letters, vol. 87, No. 8, pp. 83101, 2005.
International Search Report and Written Opinion, PCT/US2009/038568, mailed Aug. 6, 2009.
Chizmeshya, et al., J. Am. Chem. Soc. 2006,128 (21), 6919-6930.
Gersten, et al., The Physics and Chemistry of Materials, John Wiley & Sons; New York, 2001, pp. 96-100.
Dutton, et al., Inorganic Chemistry, 1968,7(9), pp. 1735-1739.
Lobreyer, T., Chem Ber, 1991, 124(11),2405-2410.
Mackay, K.M., et ai, J. Chem Soc, 1969, A, 2938.
Mooney, P. M.; et al. Annu. Rev. Mater. Sci. 2000, 30, 335.
Tromp, R. M.; et al. Annu. Rev. Mater. Sci. 2000, 30, 431.
Brunner, K., et al., Rep. Prog. Phys. 2002, 65(1),27-72.
Kuo, Y-H; et al. Nature 2005, 437,1334-1336.
Bean, J, C; et al. J. Vac Sci. Technol. 1984, A 2(2), 436-440.
Greve, DW., Mat. Sci. Eng., 1993, B18(1), 22-51.
Konig, U., et al., IEEE Electron Device Lett, 1993, 14(4),205-207.
M. L. Lee, J. Appl. Phys. 2003, 94, 2590-2596.
R. Hamond, Electron. Lett. 1999,35(18),1590-1591.
Y. J. Mii, Appl. Phys. Lett., 1991,59(13),1611-1613.
P. M. Mooney, Appl. Phys. Lett., 1995,67(16),2373-2375.
K. K. Linder, Appl. Phys Lett., 1997,70(24),3224-3226.
C. S. Peng, Appl. Phys. Lett., 1998,72(24),3160-3162.
Lee, M. L.; et al. J. Vac. Sci.Technol. 2004, B 22 (1),158.
E. Kasper, et al., Appl Surf. Sci. 2004, 224, 3.
Currie, M. T.; et al. Appl. Phys. Lett. 1998,72 (14),1718.
G. Eres, etal., J. Vac. Sci. Technol., 1993, A11(5), 2463-2471.
T. R. Bramblett, et al. J. Appl. Phys., 1995,77(4),1504-1513.
J. Takahashi, et al., Appl. Phys. Lett., 1991,58(24),2776-2778.
Nijhawan, S.; et al. J. Aerosol Science 2003,34,691-711.
Soldner, M.; et al. J. Organometallic Chern. 1996, 521, 295.
Urban, J.; et al. J. Chem. Phys. Lett. 1997,264,441-448.
Albinsson, B.; et al. J. Phys. Chem. 1996, 100, 8681.
Jasinski, J. M.; et al. Chern. Rev. 1995,95,1203.
Cullis, A.G.; et al. J. Cryst. Growth 1992, 123, 333.
Andrews et al. (1966) J. Chem. Soc. (a), p. 46-48.
Hu, Changwu, et al., "Synthesis of highly coherent SiGe and Si4Ge nanostructures by molecular beam epitaxy of H3SiGeH3 and Ge(SiH3)4", Chemistry of Materials, Sep. 23,2003,15(19):3569-3572.
Lobreyer, T., et al., "Synthesis and Structure of Tetrasilylgermane, Ge(SiH3)4, and Other Silylgermanes", Angew. Chem. Int. Ed. Engl., 1993,32(4):586-587.
Phillips, et al., Anal. Chem. 1963, 35(4): 505-510.
Phillips, et al., Z. Analyt. Chem. 1963, 197: 202-211.
Van Dyke et al., "The Preparation and Characterization of Silylgermylmethane and Some of Its Inorganic Derivatives"; Inorganic Chemistry, vol. 11, No. 2, pp. 408-412, 1972.

\* cited by examiner

METHODS AND COMPOSITIONS FOR PREPARING TENSILE STRAINED GE ON $GE_{1-y}SN_y$ BUFFERED SEMICONDUCTOR SUBSTRATES

CROSS-REFERENCE TO RELATED APPLICATIONS

This application claims the benefit of the filing dates, under 35 USC §119(e), of U.S. Provisional Application Ser. No. 60/933,013, filed 4 Jun. 2007, which is hereby incorporated by reference in its entirety.

STATEMENT OF GOVERNMENT INTEREST

The invention described herein was made in part with government support under grant number FA9550-06-01-0442, awarded by AFOSR under the MURI; and under grant number DMR-0526734, awarded by the National Science Foundation. The United States Government has certain rights in the invention.

BACKGROUND OF THE INVENTION

Germanium has a direct band gap $E_0$=0.81 eV at room temperature (see, MacFarlane and Roberts, *Phys. Rev.* 97, 1714 (1955)), which corresponds to an optical wavelength of 1.54 μm. Although this is barely enough to reach the telecom C-band (1.53 μm-1.56 μm), the very strong wavelength dependence of the absorption coefficient near the direct edge suggests that small perturbations that shift $E_0$ to lower energies should dramatically improve the performance of this material for use in optical fiber communications. The direct band gap of Ge can be reduced by alloying with Sn and by applying stress. The dependence of $E_0$ on Sn-concentration has been measured and found to be stronger than predicted, to the extent that the addition of only 2% of Sn increases the absorption coefficient at 1.55 μm by more than one order of magnitude (see, D'Costa et al., *Phys. Rev. B* 73, 125207 (2006)). The use of stress as a perturbation is problematic because the direct band gap can only be lowered with tensile strain.

This strain cannot be obtained by growing epitaxial Ge on $Ge_{1-x}Si_x$ alloys because the latter have a smaller lattice parameter. In spite of this inherent limitation, tensile-strained Ge has been obtained by depositing the material directly on Si at relatively high temperatures and by exploiting the smaller thermal expansion of the substrate to induce stress in the Ge epilayer when the sample is quenched from ~800° C. (see, Ishikawa et al., *Appl. Phys. Lett.* 82, 2044 (2003); Cannon, et al., *Appl. Phys. Lett.* 84, 906 (2004); Liu et al., *Appl. Phys. Lett.* 87, 103501 (2005); Wietler et al., *Thin Solid Films* 508, 6 (2006); and Liu et al., *Phys. Rev. B* 70, 155309 (2004)). This process leads to biaxial tensile strains as high as 0.25% in films as thick as 1 μm. While such tensile strain values may be sufficient for some photodetector designs, higher strain values are necessary for most optoelectronic applications which require tunable direct gaps (see, Liu et al., 2004, supra).

Further limitations of the thermal expansion process include lack of precise strain control and a maximum predicted strain value of 0.3% for growth at 900° C. (see, Cannon, et al., supra). Moreover, the use of high temperatures (800-900° C.) typically induces inter-diffusion of the elements across the Si-Ge heterojunction, resulting in non-uniform and potentially defective interfaces. In the context of laser applications, spatial confinement requires abrupt interfaces, which are precluded using this high temperature process due to the inherent elemental intermixing at the interface. In addition, precise and systematic control of the final strain state has not been demonstrated using this method, and this hampers the design of devices.

Thus, there exists a need in the art for improved methods of preparing tensile strained Ge on semiconductor substrates.

SUMMARY OF THE INVENTION

In one aspect, the present invention provides methods for preparing a semiconductor structure comprising:
  a) forming a $Ge_{1-y}Sn_y$ buffer layer on a semiconductor substrate; and
  b) forming a tensile strained Ge layer on the $Ge_{1-y}Sn_y$ buffer layer using an admixture of $(GeH_3)_2CH_2$ and $Ge_2H_6$ in a ratio of between 1:10 and 1:30.

In a second aspect, the present invention provides semiconductor structures made by the methods of the first aspect of the invention.

In a third aspect, the present invention provides semiconductor structures comprising a semiconductor substrate; a $Ge_{1-y}Sn_y$ buffer layer formed over the substrate, and a tensile strained Ge layer formed over the $Ge_{1-y}Sn_y$ buffer layer.

In a fourth aspect, the present invention provides compositions comprising $(GeH_3)_2CH_2$ and $Ge_2H_6$ in a ratio of between 1:10 and 1:30.

Herein is provided an approach based for the generation of tensile-strained Ge epilayers based on the creation of $Ge_{1-y}Sn_y$ alloys with tunable lattice dimensions above that of Ge which serve as the critical facilitating platforms for the subsequent tensile-Ge growth. In addition this approach subsumes the following distinctive features: (i) low growth temperature that promotes the assembly of highly-strained tetragonally-distorted Ge structures that remain robust despite the inherent metastability. (ii) layer-by-layer growth mechanisms leading to flat surfaces, chemically abrupt interfaces devoid of chemical intermixing and relatively defect free layer microstructures. Both features are enabled by exploiting the high reactivity and the pseudo-surfactant behavior of the $(GeH_3)_2CH_2$ species. Collectively this methodology has allowed the systematic production of Ge layers with very high tensile strains and all of the desired morphological and structural properties as discussed below. Thereby, the utility of Ge can be extended into the wider infrared optoelectronic domain by tuning its fundamental optical properties using strain as a main parameter

DETAILED DESCRIPTION OF THE INVENTION

Figure 1:
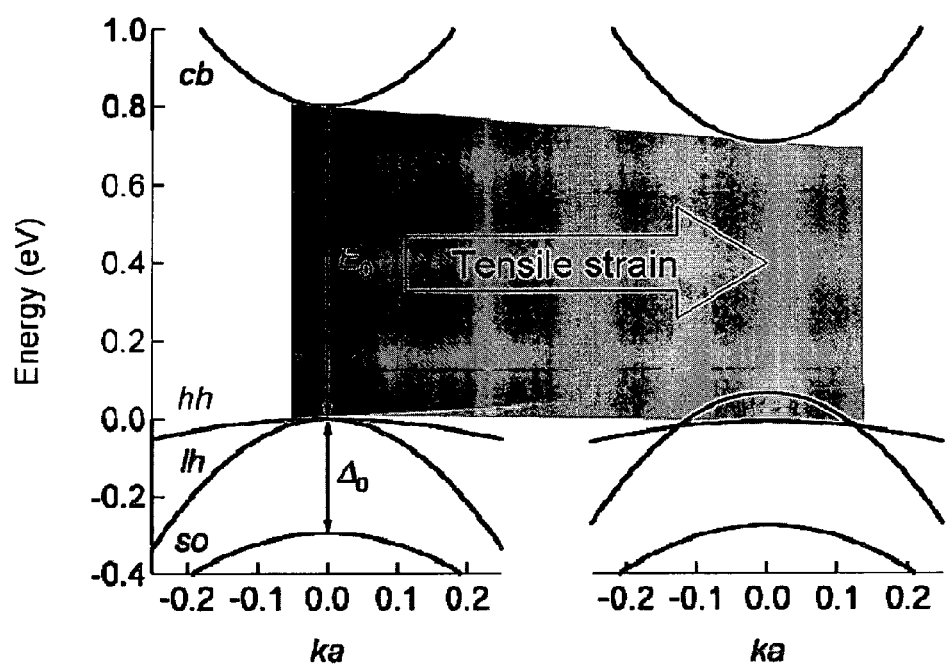
FIG. 1 shows the electronic band structure of Ge near the lowest direct band gap $E_0$. Here, k is the wave vector along the <100> direction, and a the cubic lattice constant. The bands are indicated as cb (conduction band), hh (heavy hole band), lh (light hole), and so (split off band). The valence band spin-orbit splitting at k=0 is $\Delta_0$. The right panel shows the bands calculated for a tensile strain of 1% using absolute deformation potentials as in Ref. 15. The strain dependence of the effective masses was ignored. The zero of energy is chosen at the top of the valence band in the unstrained case (left panel).

As demonstrated herein, the tensile-strained Ge layers of the invention display homogeneous compositional and strain profiles, low threading dislocation densities and atomically planar surfaces, and the resulting semiconductor structure and methods for making it are compatible with, for example, selective growth, optical fiber communication applications, and back-end CMOS telecommunication applications.

In the case of pure Ge, increasing the tensile strain beyond the values allowed by the thermal expansion method is highly desirable. The so-called telecom U-band can be covered with a biaxial tensile strain of 0.4%. Our approach has provided strains as high as 0.45% which is suitable for generating U-bands and represents the highest value ever observed. As described below, the availability of Sn-based buffers allows the growth of strained Ge films to be conducted at unprecedented low temperatures (350-380° C.) which are compatible with selective growth and back-end CMOS telecommunication applications.

The $Ge_{1-y}Sn_y$ buffer layer can be a single layer, or can be a plurality of layers, such as a graded layer, and can be formed with a thickness ranging between 50 nm and several microns. In various embodiments, the semiconductor buffer layer has a thickness in a range from 50 nm to 10 microns. In various other embodiments, the semiconductor buffer layer has a thickness in a range from about 50 nm to 1 micron. In various embodiments, the semiconductor buffer layer has a thickness in a range from 50 nm to 500 nm or in a range from about 20 nm to 300 nm.

In various embodiments, the Sn content varies between 1.5% and 3.5% (i.e., y is between 0.015 and 0.035). In a further embodiment, the method further comprises in situ thermal cycling (i) at a temperature of between 500° C. and 600° C. for a period of time ranging from about 1 sec. to 120 minutes; or (ii) by rapid thermal annealing at temperatures ranging up to about 850-900° C. for 1-100 seconds, following forming of the $Ge_{1-y}Sn_y$ buffer layer on a semiconductor substrate, to reduce residual strain. In a further embodiment, the $Ge_{1-y}Sn_y$ buffer layer is at least 90% relaxed; in various further embodiments, at least 91%, 92%, 93%, 94%, 95%, 96%, 97%, or more relaxed.

The Ge layer can be formed as a single layer, and can be formed over or formed directly on the one or more $Ge_{1-y}Sn_y$ buffer layers (as noted above) with a thickness ranging between 30-200 nm or thicker depending on the critical thickness of the sample. In certain embodiments, the Ge layer can be formed as a single layer, and can be formed over or formed directly on the one or more $Ge_{1-y}Sn_y$ buffer layers (as noted above) with a thickness ranging between about 50-200 nm or thicker depending on the critical thickness of the sample.

In certain embodiments, the Ge layer can be formed as a single layer directly on the one or more $Ge_{1-y}Sn_y$ buffer layers. In certain other embodiments, the Ge layer can be formed as a single layer formed directly on the one or more $Ge_{1-y}Sn_y$ buffer layers (as noted above) with a thickness ranging between about 30-200 nm or about 50-200 nm or thicker depending on the critical thickness of the sample. It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate. It should be further understood that when a layer is referred to as being "directly on" another layer or substrate, the two layers are in direct contact with one another with no intervening layer. It should also be understood that when a layer is referred to as being "directly on" another layer or substrate, it may cover the entire layer or substrate, or a portion of the layer or substrate.

In various embodiments, the Ge layer has a tunable tensile strain of between 0.15% and 0.45% In a further embodiment, the Ge layer is tetragonal; tetragonal distortion leads to the split of the heavy/light hole bands which ultimately leads to novel optoelectronic properties such as direct gaps and high mobilities in doped systems. As used herein, "tensile strain" refers to deformation along a layer segment that increases in length and width when a load/perturbation is applied that stretches the layer within the horizontal pane and reduces its vertical dimension.

The semiconductor substrate can be any substrate suitable for semiconductor use, including but not limited to silicon, silicon on insulator, $SiO_2$, Si:Ge alloys, and Si:C alloys. In a preferred embodiment, the substrate comprises silicon, including but not limited to Si(100). The semiconductor substrates can be n- or p-doped as is familiar to those skilled in the art; for example, n- or p-doped Si(100).

In various embodiments, the semiconductor buffer layer has a thickness in a range from 50 nm to several microns. In various embodiments, the semiconductor buffer layer has a thickness in a range from 50 nm to 10 microns. In various other embodiments, the semiconductor buffer layer has a thickness in a range from about 50 nm to 1 micron. In various embodiments, the semiconductor buffer layer has a thickness in a range from 50 nm to 500 nm or in a range from about 20 nm to 300 nm. In further embodiments, the semiconductor buffer layers have a density of threading defects of $10^6/cm^2$ or less.

In a further embodiment, the semiconductor substrates of the invention comprise a $Ge_{1-y}Sn_y$ buffer layer and/or a Ge layer having a substantially atomically planar surface morphology (i.e., essentially atomically flat). As used herein, the terms "substantially atomically planar" and "essentially atomically flat" means that the referenced surface has an RMS roughness value of less than about 1.0 nm as measured by atomic force microscopy according to methods familiar to one skilled in the art. Preferably, that the referenced surface has an RMS roughness value of less than about 0.75 nm or an RMS roughness value ranging from about 0.2 to 1.0 nm or about 0.3 to about 0.75 nm.

In other embodiments, the Ge layers formed according to the present methods of the invention are Ge layer epitaxial. The term "epitaxial" as used herein, means that a material is crystalline and fully commensurate with the substrate. Preferably, epitaxial means that the material is monocrystalline, as defined herein. The term "monocrystalline" as used herein, means a solid in which the crystal lattice of the entire sample is continuous with no grain boundaries or very few grain boundaries, as is familiar to those skilled in the art.

The methods comprise depositing the Ge layer on the buffer layer, which may involve introducing into a reaction chamber a gaseous precursor comprising or consisting of an admixture of $(GeH_3)_2CH_2$ and $Ge_2H_6$ in a ratio of between 1:10 and 1:30 (or, in other embodiments, 1:10 to 1:25; 1:11 to 1:25, 1:12 to 1:25; 1:13 to 1:25; 1:14 to 1:25; 1:15 to 1:25; 1:10 to 1:20; 1:10 to 1:19; 1:10 to 1:18, 1:10 to 1:17; 1:10 to 1:16, 1:10 to 1:15), under conditions whereby the Ge layer material is formed on the buffer layer. In a particular embodiment, the admixture comprises $(GeH_3)_2CH_2$ and $Ge_2H_6$ in a ratio of between 1:15 and 1:25.

In another embodiment, the methods comprise depositing the Ge layer on the buffer layer, which may involve introducing into a reaction chamber a gaseous precursor comprising or consisting of an admixture of $(GeH_3)_2CH_2$ and $Ge_2H_6$ in a ratio of between about 1:20 and 1:30 (or, in other embodiments, 1:21 to 1:30, 1:22 to 1:30, 1:23 to 1:30, 1:24 to 1:30, 1:25 to 1:30; 1:26 to 1:30, 1:27 to 1:30; 1:28 to 1:30; and 1:29 to 1:30.

In various embodiments, the step of introducing the gaseous precursor comprises introducing the gaseous precursor in substantially pure form. In another embodiment, the step of introducing the gaseous precursor comprises introducing the gaseous precursor intermixed with an inert carrier gas. In this embodiment, the inert gas can be, for example, $H_2$ or $N_2$.

In the methods of the invention, the gaseous precursor can be deposited by any suitable technique, including but not limited to gas source molecular beam epitaxy, chemical vapor deposition, plasma enhanced chemical vapor deposition, laser assisted chemical vapor deposition, and atomic layer deposition. In a further embodiment, the gaseous precursor is introduced by gas source molecular beam epitaxy at between at a temperature of between 300° C. and 420° C., more preferably between 350° C. and 400° C., and even more preferably between 350° C. to 380° C. Practical advantages associated with this low temperature/rapid growth process include (i) short deposition times compatible with preprocessed Si wafers, (ii) selective growth for application in high frequency devices, and (iii) negligible mass segregation of dopants, which is particularly critical for thin layers.

In various further embodiments, the gaseous precursor is introduced at a partial pressure between $10^{-8}$ and 1000 Torr. In one embodiment, the gaseous precursor is introduced at between $10^{-8}$ Torr and $10^{-3}$ Torr for gas source molecular beam epitaxy. In another embodiment, the gaseous precursor is introduced at between $10^{-7}$ Torr and $10^{-4}$ Torr for gas source molecular beam epitaxy. In yet another embodiment, the gaseous precursor is introduced at between $10^{-6}$ Torr and $10^{-5}$ Torr for gas source molecular beam epitaxy.

All definitions and embodiments described above for the methods of the invention apply to the semiconductor structure aspects of the invention.

The semiconductor structures of the invention may further comprise other features as desired, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art.

In another aspect, the present invention provides composition, comprising $(GeH_3)_2CH_2$ and $Ge_2H_6$ in a ratio of between 1:10 and 1:30. In various preferred embodiments, the composition comprises the individual components in a ratio of 1:10 to 1:25; 1:11 to 1:25, 1:12 to 1:25; 1:13 to 1:25; 1:14 to 1:25; 1:15 to 1:25; 1:10 to 1:20; 1:10 to 1:19; 1:10 to 1:18, 1:10 to 1:17; 1:10 to 1:16, 1:10 to 1:15. In a further embodiment of each of these embodiments, the composition is in a gaseous form. In particular embodiment, the composition comprises $(GeH_3)_2CH_2$ and $Ge_2H_6$ in a ratio of between 1:15 and 1:25.

In another embodiment, the present invention provides composition, comprising $(GeH_3)_2CH_2$ and $Ge_2H_6$ in a ratio of between about 1:20 and 1:30 (or, in other embodiments, 1:21 to 1:30, 1:22 to 1:30, 1:23 to 1:30, 1:24 to 1:30, 1:25 to 1:30; 1:26 to 1:30, 1:27 to 1:30; 1:28 to 1:30; and 1:29 to 1:30.

EXAMPLES

Example 1

General Deposition Procedures

Example 1a

GeSn Buffer Deposition $Ge_{1-y}Sn_y$ buffer layers (y=0.02-0.04) were deposited on hydrogen-passivated Si(100) wafers at 330-350° C., as described previously (see, Bauer et al., *Appl. Phys. Lett.* 81, 2992 (2002), which is hereby incorporated by reference in its entirety). The as-grown $Ge_{1-y}Sn_y$ films were ~93-95% relaxed (even for thicknesses less than 100 nm) and achieve strain relief from the substrate by generating Lomer dislocations that run parallel to the film/substrate interface. The residual strain was relieved by in situ thermal cycling for 30 minutes at 500-600° C. or by rapid thermal annealing up to 850° C. for several seconds, depending on composition. These steps also reduces the density of threading defects penetrating to the surface to levels below $10^6/cm^2$. Atomic force microscopy (AFM) shows planar surfaces for both the as-grown and annealed $Ge_{1-y}Sn_y$ buffers that provide an ideal platform for subsequent growth. The typical RMS roughness was in the range of 0.5-0.8 nm for 10×10 µm² areas.

Example 1b

Tensile Strained Ge Deposition

Growth of Ge epilayers was conducted ex situ on the relaxed $Ge_{1-y}Sn_y$ buffers (y=0.02-0.04) via gas-source molecular beam epitaxy (MBE) at 340-380° C. and 5×10$^{-5}$ Torr using 1:15 admixtures of (GeH$_3$)$_2$CH$_2$ and Ge$_2$H$_6$. This combination of compounds was designed to provide built-in pseudo surfactant growth behavior enabling the fabrication of dislocation free, and atomically flat Ge films with no measurable carbon incorporation. SIMS measurements indicate C content at the detection limit (<3×10$^{17}$ cm$^{-3}$) (see, Wistey et al., *Appl. Phys. Lett.*, 90, 082108 (2007)).

The reaction mixture of (GeH$_3$)$_2$CH$_2$ in Ge$_2$H$_6$ was prepared prior to each deposition by combining the pure compounds in a 100 mL vacuum flask. The total pressure was 115 Torr, which is well below the vapor pressure of (GeH$_3$)$_2$CH$_2$ (248 Torr at 25° C.). The flask was connected to a gas injection manifold which was pumped to ~10$^{-8}$ Torr on the gas source MBE chamber.

Prior to Ge growth, the Ge$_{1-y}$Sn$_y$/Si(100) substrates were sonicated for 5 minutes in methanol, dried by flowing N$_2$ over their surface, inserted through a load lock into an ultra high vacuum (UHV) chamber at a base pressure of 5×10$^{-10}$ Torr, and then heated on the sample holder for one hour at 250° C. to desorb any volatile surface contaminants until the chamber pressure was restored to the base value of 10$^{-10}$ Torr. Under these conditions we find that the Ge$_{1-y}$Sn$_y$ surfaces exhibit the typical (2×1) to (1×2) reconstruction, indicating a well-ordered crystallographic state suitable for subsequent heteroepitaxial growth.

The temperature was then increased to 360-380° C. and the reactant gases were admitted at a final pressure of 5×10$^{-5}$ Torr to commence film growth. The pressure was maintained constant (5×10$^{-5}$ Torr) during growth via dynamic pumping using a corrosion resistant turbomolecular pump. Typical growth times from 30-60 minutes yielded films of thickness in the range 30-60 nm, respectively, at a fixed growth temperature of 360° C. The Ge films were deposited at a rate of 2 nm/min. Under these conditions Ge growth was observed to proceed via nucleation of nanoscale atomically-flat mesas which gradually coalesce to produce continuous films with planar surfaces as evidence by AFM characterizations.

At growth temperatures of 380° C. and higher, a significant increase in growth rate and a surface morphology consisting of two-dimensional tiling formations based on rectangular mesas with variable shape and size were observed. On the length scale of the mesas (~1 μm) the film surface is atomically flat; however, on the scale of 2-5 μm the surface roughness is higher due the presence of vertical steps between the mesas.

Example 2

Structural and Optical Characterization

The samples prepared according to Example 1 were extensively characterized for morphology, microstructure, purity and crystallographic properties by atomic force microscopy (AFM), Rutherford backscattering (RBS), secondary ion mass spectrometry (SIMS), cross sectional transmission electron microscopy (XTEM) and high resolution x-ray diffraction (XRD). The threading defects densities were estimated using an etch pit technique (EPD).

As detailed below, the precise strain state of the Ge epilayers case can be systematically manipulated by varying the thickness and composition of the underlying template, for example, via tuning of the Sn content in the Ge$_{1-y}$Sn$_y$ buffer. Growth of Ge layers on buffers with smaller/larger lattice constants, such as Ge$_{1-y}$Sn$_y$ with y=0.015-0.035,) systematically produced larger strains in the Ge overlayers with increasing y, within the 1.5-3.5% range.

We have used the Ge$_{1-y}$Sn$_y$ buffer layers (y=0.015-0.035) to demonstrate that the highest reported tensile strains on Ge can be easily reproduced within this composition range, although record strains as high as 0.45% have already been achieved by our method. Advantageously, these buffer compositions have been shown to possess high thermal stability (up to 800° C.) and to be compatible with conventional CMOS processing.

Combined Raman analysis and high-resolution x-ray diffraction using multiple off-axis reflections revealed unequivocally that the symmetry of tensile Ge was perfectly tetragonal. A downshift of the direct gap consistent with tensile strain has been observed.

The degree of tensile strain alters the Ge band structure and induces a tunable redshift of the direct gap E$_0$ absorption edge. FIG. 1 shows the quantitative changes in the band structure for 1% tensile strain in Ge. Small reductions in E$_0$ can dramatically improve the detection performance of this material at 1.55 μm and beyond to cover the technologically important near-IR telecom bands for use in optical fiber communications. For sufficiently large tensile strain it has been predicted that Ge may become a direct gap system, with potential applications as an active lasing material (see, Menendez and Kouvetakis, J. *Appl. Phys. Lett.* 2004, 85, 1175).

Example 2a

Surface Characterization

Figure 2:
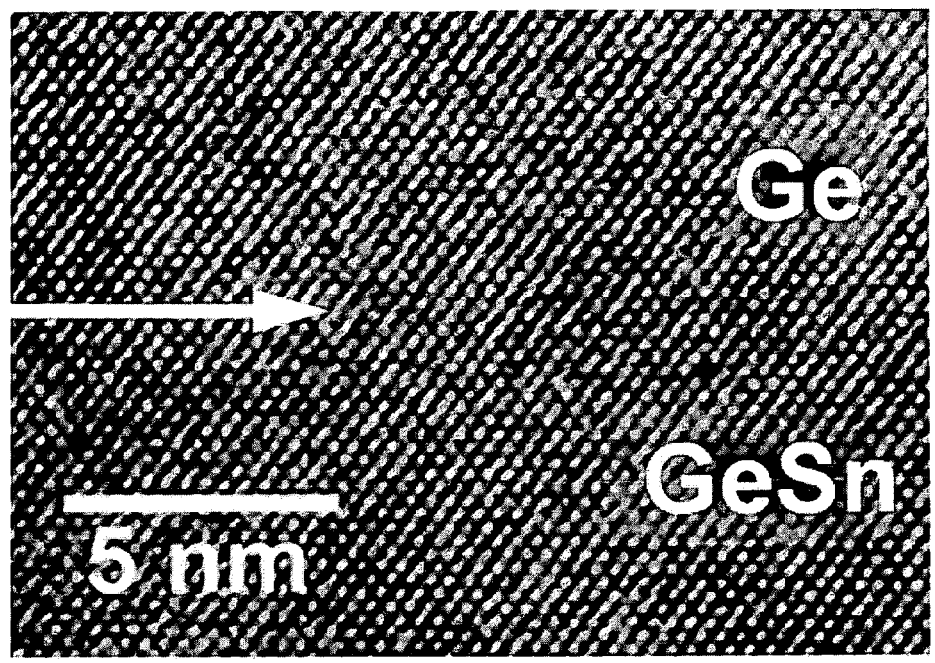
FIG. 2 is a high resolution image of the corresponding an Ge/GeSn interface (arrow) for an embodiment of the invention showing perfect commensuration of the (111) lattice planes.
Figure 3:
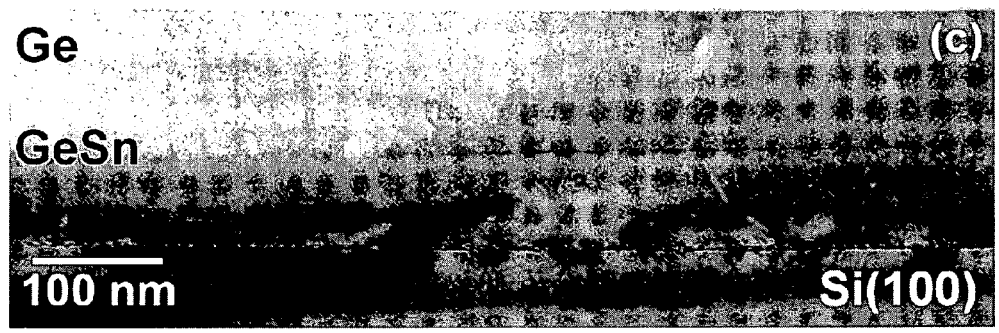
FIG. 3 is a diffraction contrast XTEM image of an entire Ge/GeSn/Si structure according to an embodiment of the invention.

In XTEM studies of the materials prepared according to Example 1 revealed monocrystalline Ge epilayer films possessing commensurate interfaces and atomically smooth surfaces regardless of the epilayer thickness. Electron micrographs demonstrated heteroepitaxial growth of a 60 nm thick Ge film on a 200 nm thick Ge$_{1-y}$Sn$_y$ buffer with ε$_∥$=0.25% (see, FIGS. 2 & 3). The diffraction contrast image of the entire film thickness in (110) projection (FIG. 3) shows an atomically flat surface and a film devoid of threading dislocations within the field of view.

Surface flatness was confirmed on a larger 10×10 μm$^2$ scale by AFM scans, which show RMS roughness values of 0.5 nm. A corresponding high resolution image showed a sharp interface between the two materials that is fully commensurate and defect-free. Occasional threading defects are observed to propagate, however, from the Si interface through the buffer and terminate at the Ge/GeSn interface, suggesting that deflection and bending of dislocations into the plane of this interface may be taking place.

The typical RBS spectra (in random and channeled modes) showed consistently monocrystalline and perfectly aligned materials. The ratio of the aligned and random spectra (X$_{min}$), which measures the degree of epitaxial registry was extremely low, an X$_{min}$ value of 10% within the Ge layer, close to the 3% limit for Si (100) wafers.

Example 2b

Raman Analysis

Combined Raman analysis and high-resolution x-ray diffraction using multiple off-axis reflections reveal unequivocally that the symmetry of tensile Ge epilayers, with varying thickness, prepared according to Example 1 are perfectly tetragonal, while the strain state of the buffer remains essentially unchanged. A downshift of the direct gap consistent with tensile strain has been observed.

The growth strategies herein provide controlled and reproducible Ge strain values exceeding those obtained to date, leading to values of tensile strain as high as 0.8%. The strain in this case can be systematically manipulated by varying the thickness and composition of the underlying template.

Figure 4:
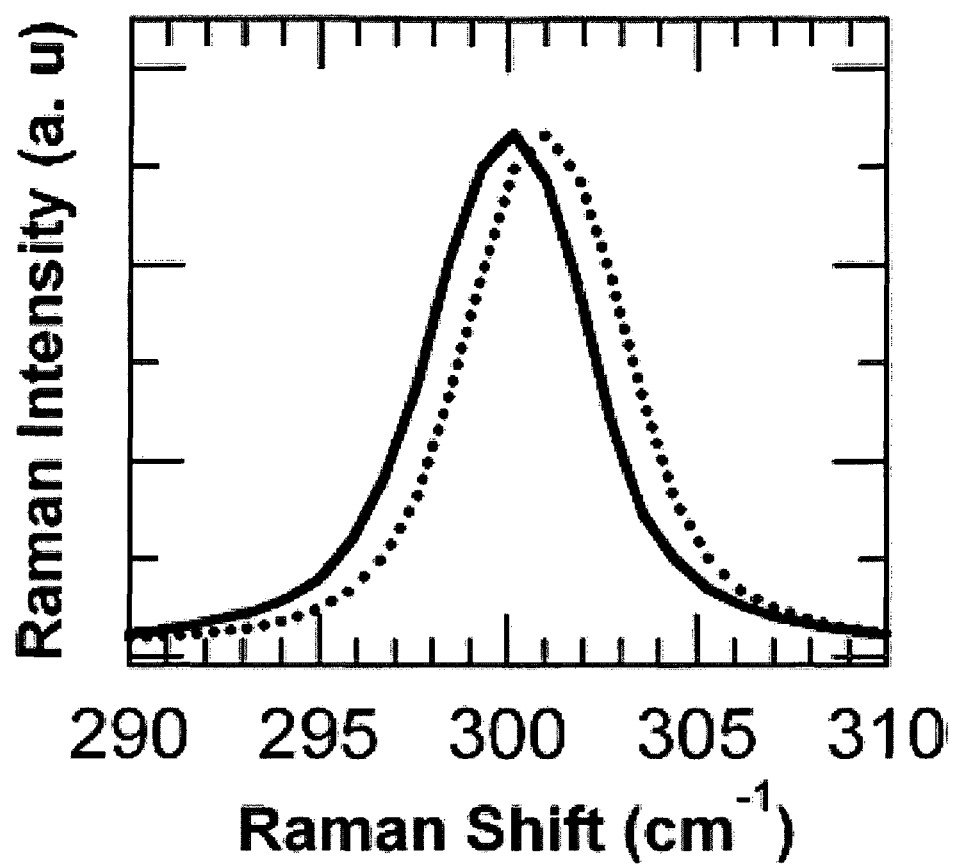
FIG. 4 is a room temperature Raman spectrum comparing a tensile-strained Ge film (solid line) and a bulk Ge crystal (dotted line). The spectra were obtained with 514.5 nm

FIG. 4 shows a Raman spectrum from a tensile-strained Ge-film in a Ge/Ge$_{0.975}$Sn$_{0.025}$ structure. The Raman peak is clearly downshifted relative to the corresponding Raman peak in bulk Ge. Tetragonal strain splits the three-fold degenerate optical phonons at the center of the Ge Brillouin zone into a doublet and a singlet. For the (001) backscattering configuration used here, only the singlet is observable, and its shift relative to bulk Ge is given by $\Delta\omega=b\epsilon_p$, with $b=[q-p(C_{12}/C_{11})]/\omega_0$. Here p and q are the optical phonon anharmonic parameters, as defined, for example, in Anastassakis and Cardona in *High Pressure in Semiconductor Physics II*, ed. by T. Suski and W. Paul (Academic Press, New York, 1998)), and $\omega_0$ is the Raman frequency in bulk Ge. Using values from Anastassakis (supra), we obtain b=-415±40 cm$^{-1}$. Thus from the observed Raman shift $\Delta\omega=1.0\pm0.1$ cm$^{-1}$, we deduce $\epsilon_{\parallel}=-0.24\pm0.04\%$, in excellent agreement with the X-ray analysis. Moreover, initial photoreflectance experiments on this sample confirm the downshift of the direct gap induced by the tensile strain.

Figure 5:
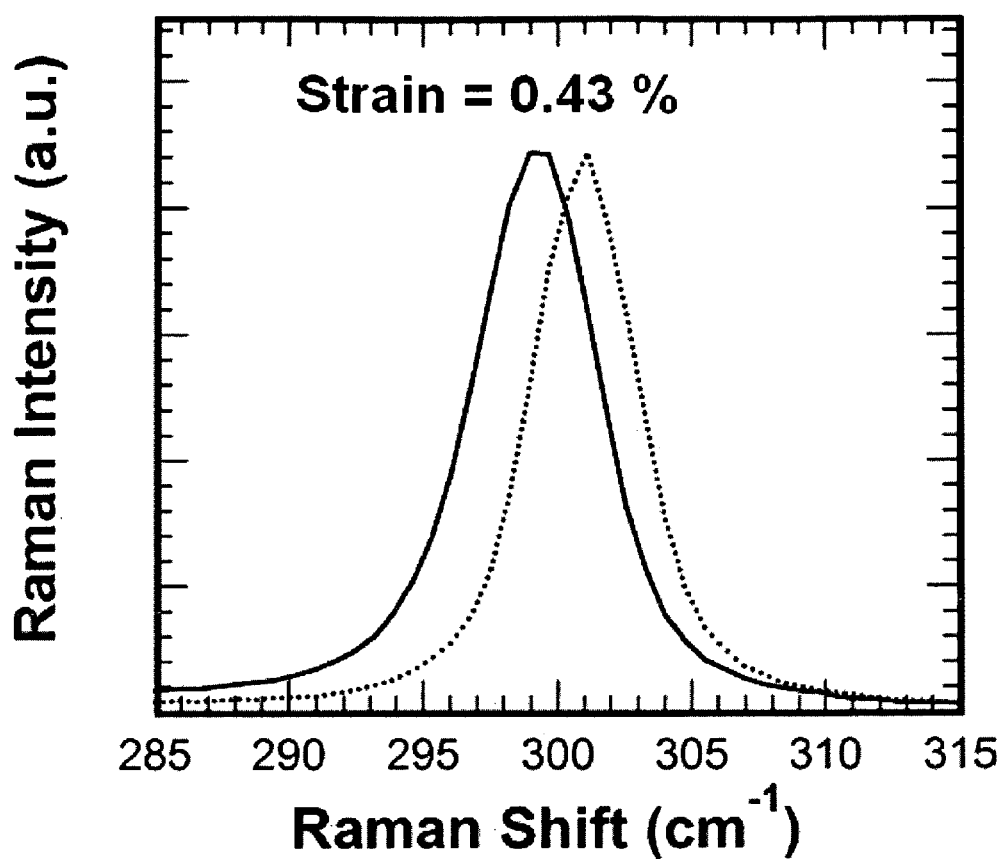
FIG. 5 is a room temperature Raman spectrum comparing a tensile-strained Ge film (solid line) and a bulk Ge crystal (dotted line). The spectra were obtained with 514.5 nm
Figure 6:
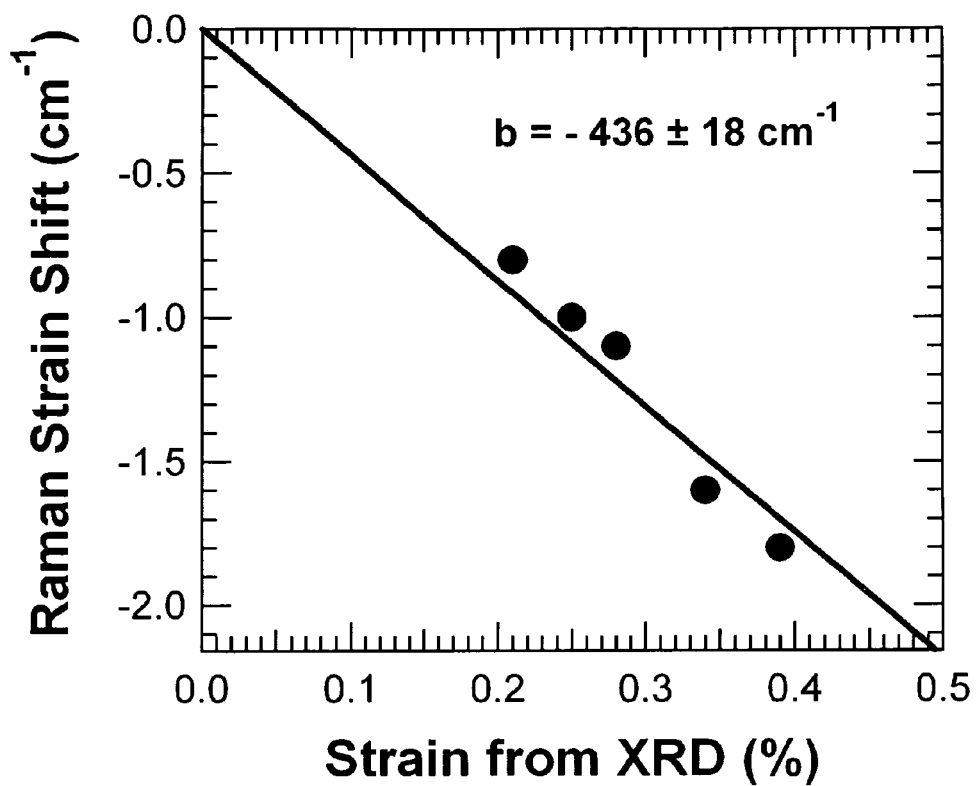
FIG. 6 is a graph illustrating the plane strain induced Raman shifts in tensile-strained Ge/GeSn films (solid line) as a function of the in-plane strain measured via XRD.

FIG. 5 shows a typical Raman spectrum of a Ge/Ge$_{0.965}$Sn$_{0.035}$ sample compared to that of a bulk Ge reference. Again, the peak of the Ge film is shifted to lower energies, as expected for tensile strain. The results for this and similar samples are summarized in FIG. 6, where we plot the Raman shifts of the Ge-films with strains intermediate to 0.15 and 0.43% (with respect to the Raman shift in pure Ge) as a function of the measured in-plane strain obtained from XRD (infra). A monotonic and approximately linear dependence was observed, which confirms the XRD results. A fit with Eq.(1) yields $b_{Ge}=436\pm18$ cm$^{-1}$. This overlaps considerably with the earlier results of Cerdeira et al. (see, *Phys. Rev. B* 1972, 5, 580). Thus we conclude that, as in the case of Si, the original strain shift coefficients determined in the 70's are sufficiently accurate to characterize strain using Raman spectroscopy. Finally we note that preliminary photoreflectance studies of selected samples have shown a downshift of the direct gap consistent with tensile strain.

Example 2c

XRD Analysis

The strain state of the Ge films was further investigated by recording line scans and reciprocal space maps for the symmetric (004), and asymmetric (224) Bragg reflections. In each case the data were referenced to the corresponding reflections of the Si wafer.

Figure 7:
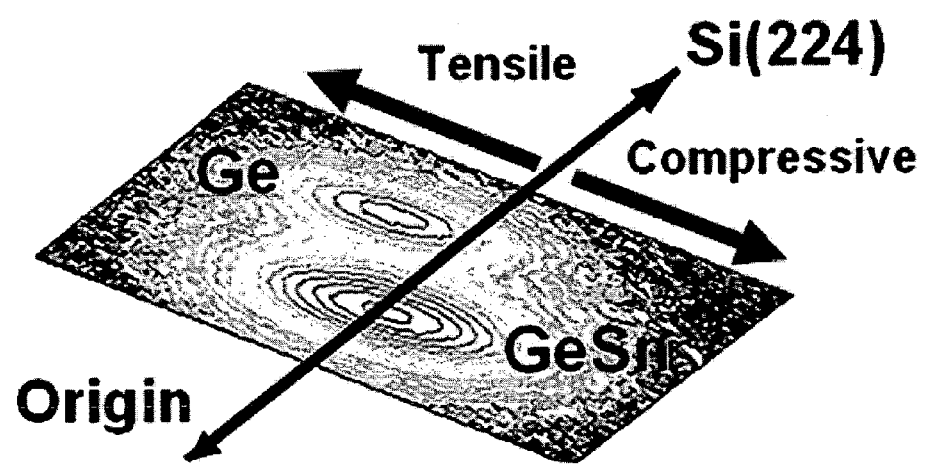
FIG. 7 is an XRD reciprocal space map of the (224) reflections, showing a Ge epilayer and a $Ge_{0.975}Sn_{0.025}$ buffer relative to the Si substrate peak for an embodiment of the invention. The Ge peak falls above the relaxation line connecting the Si peaks and the origin, indicating tensile strain.

The data were acquired with a PANalytical™ X'Pert MRD system (PANalytical B.V., Almelo, Netherlands) and were referenced for each sample to the corresponding reflections of the Si wafer. FIG. 7 shows the (224) reciprocal space map for a $_{Ge/Ge0.975}$Sn$_{0.025}$ structure with epilayer and buffer thicknesses of 60 nm and 200 nm, respectively.

For the Ge$_{0.975}$Sn$_{0.025}$ layer, the diffracted intensity peaks lie very close to the full relaxation line ((224) line in FIG. 7). A numerical fit yields $a_{\parallel,GeSn}=5.6742$ Å and $a_{\perp,Ge}=5.6794$ Å, which corresponds to a compressive strain of −0.05%. The vertical alignment of the Ge and GeSn (224) peaks indicates a coherent heterostructure, while the considerable offset of the Ge peak with respect to the relaxation line implies a significant tensile strain. The measured in-plane ($a_{\parallel,Ge}=5.6719$ Å) and vertical ($a_{\perp,Ge}=5.6476$ Å) lattice parameters are related by the tetragonal strain relation $\epsilon_{\perp}=-2C_{12}/C_{11}\epsilon_{\parallel}$, where $C_{11}$ and $C_{12}$ are bulk Ge elastic constants, and the strain is defined as $\epsilon_{\parallel}=(a_{\parallel}-a_0)/a_0$ and $\epsilon_{\perp}=(a_{\perp}-a_0)/a_0$. By averaging published experimental values for the elastic constants (see, O. Madelung, in *Semiconductors*, Landolt Börstein New Series III (Springer-Verlag, Berlin, N.Y., 2001), Vol. 41-A), we obtain $2C_{12}/C_{11}=0.72\pm0.04$, from which we calculate $a_0=5.6578$ Å. This is in excellent agreement with measurements in relaxed Ge films and with published values for the lattice constant of bulk Ge (see, Madelung, supra). Using the calculated relaxed lattice constant, we estimate for our sample a strain value $\epsilon_{\parallel}=-0.25\pm0.02\%$, where the error arises from the scattering of the elastic constant data and the uncertainty in the determination of the maxima in the reciprocal space maps.

In previous work we showed that Ge$_{1-y}$Sn$_y$ alloys display a compliant behavior when used as buffer layers for the growth of lattice-mismatched Ge$_{1-x-y}$Si$_x$Sn$_y$ alloys (see, Tolle, et al., *Appl. Phys. Lett.* 88, 252112 (2006)). The lattice constant $a_\parallel$ for the buffer and epilayer was found to approach the value predicted from a simple strain energy minimization expression that neglects the interaction with the Si substrate. For the sample in FIG. 7 such a model predicts a compressive buffer strain $\epsilon_{\parallel}=0.08$, in reasonably agreement with the observed value. To exp incorporate the same buffer layer but a much thicker Ge film (140 nm) than the previously discussed sample (60 nm). Then the compressive strain on the buffer layer should increase to $\epsilon_{\parallel}=-0.14$.

XRD data including the (224) and (004) reflections indicated that the buffers remain virtually unchanged with $a_{\parallel,GeSn}=5.6731$ Å and $a_{\perp,GeSn}=5.6794$ Å, which correspond to $\epsilon_{\parallel}=-0.06$. The lattice constants $a_{\parallel,Ge}=5.6704$ Å and $a_{\parallel,GeSn}=5.6731$ Å are again very close, indicating the same degree of coherency as in the previous structure. The calculated unstrained Ge lattice constant ($a_0=5.6576$ Å) is virtually identical to the one obtained for the previous sample. The strain analysis yields $\epsilon_{\parallel}\sim-0.23\%$, which is nearly the same as that of the 60 nm thick Ge sample. This value is within the 0.02% error shown above. Therefore, these experiments do not show evidence for a compliant buffer behavior. It is interesting to point out, however, that in the present case the strain energy densities are smaller than in Tolle et al. (supra) by up to one order of magnitude, so that neglecting the buffer-substrate interaction may no longer be a good approximation.

The larger scattering volume of the 140 nm thick sample enabled us to measure typically weak off-axis peaks such as the (135) and ($\overline{1}$35) reflections. These have h<k and accordingly they are sensitive to deviations from a tetragonal distortion. If the Ge film distortion is of lower symmetry than tetragonal, the in-plane value derived from these reflections will deviate significantly from their (224) counterpart. Table 1 compares both the in-plane and vertical lattice constants ($a_\parallel$ and $a_\perp$ respectively), for the Si substrate, the GeSn buffer layer and the strained Ge epilayer. In all three cases the in-plane lattice constant values obtained independently from the (135), ($\overline{1}$35) and (224) analysis are identical, within instrumental resolution.

TABLE 1

In-plane and perpendicular lattice constants for the Si substrate, Ge$_{0.975}$Sn$_{0.025}$ buffer layer and strained Ge epilayer as determined from independent x-ray reflections (004), (224), (135) and ($\bar{1}$35)

| | Reflection | a (Å) | c (Å) |
|---|---|---|---|
| Si | (004) | | 5.4306 |
| | (224) | 5.4305 | 5.4305 |
| | (135) | 5.4306 | 5.4307 |
| | ($\bar{1}$35) | 5.4305 | 5.4305 |
| | | 5.4305 | 5.4306 |
| GeSn | (004) | | 5.6801 |
| | (224) | 5.6731 | 5.6794 |
| | (135) | 5.6735 | 5.6798 |
| | ($\bar{1}$35) | 5.6730 | 5.6800 |
| | | 5.6702 | 5.6798 |
| Ge | (004) | | 5.6484 |
| | (224) | 5.6703 | 5.6482 |
| | (135) | 5.6704 | 5.6485 |
| | ($\bar{1}$35) | 5.6702 | 5.6484 |
| | | 5.6703 | 5.6484 |

Figure 8:
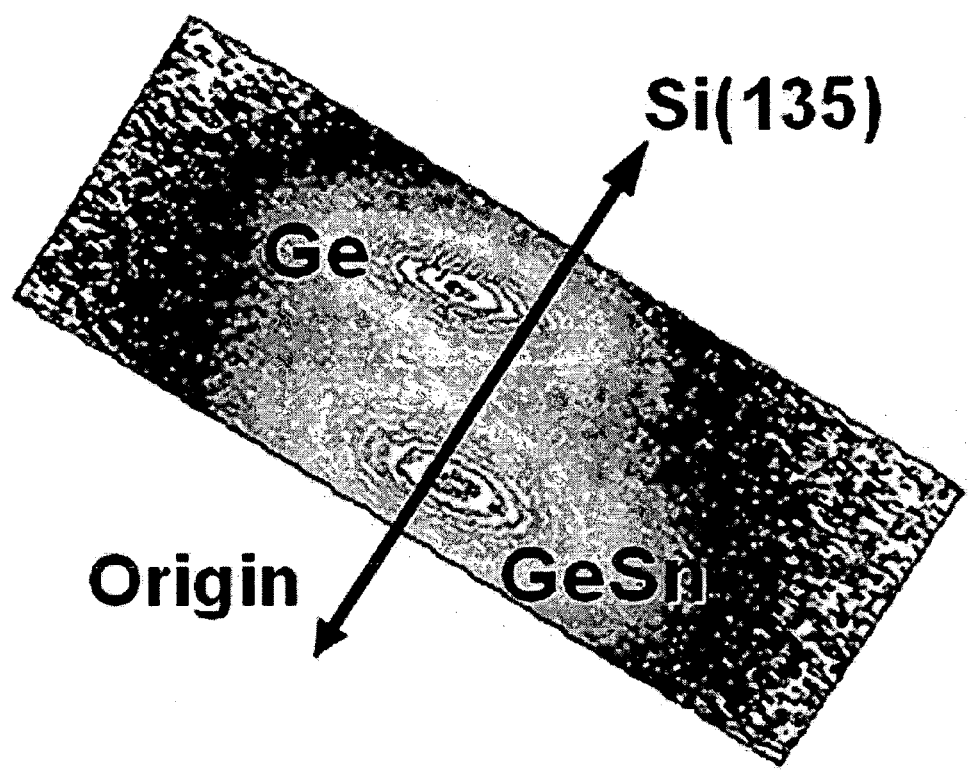
FIG. 8 is an XRD reciprocal space map of the (135) reflections, showing a Ge epilayer and a $Ge_{0.975}Sn_{0.025}$ buffer relative to the Si substrate peak for an embodiment of the invention. As for the (224) peak, the (135) Ge peak lies above the relaxation line connecting the Si peaks and the origin, indicating tensile strain.

A similar independent analysis of the (004), (135), ($\bar{1}$35) and (224) peaks also yields vertical lattice constants that are virtually identical within experimental error. Collectively these data demonstrate that the Ge epilayer displays a perfect tetragonal distortion, verifying the underlying assumption in our strain analysis above. In addition, Table 1 shows that Si is perfectly cubic as expected, and that the buffer is only slightly compressed, as shown in FIG. 8, where the diffraction maps for the (135) peaks of the Ge epilayer and GeSn buffer are shown. It should be noted that for samples grown on unrelaxed GeSn buffers we consistently observe discrepancies in the $a_{81}$ parameter derived from the (224), (135) and ($\bar{1}$35) reflections, demonstrating a non-tetragonal deformation. This indicates that residual compressive strains in the as grown buffers lead to tensile strained Ge layers possessing complicated lower symmetries associated with monoclinic or orthorhombic distortions. This emphasizes the crucial need to relax the buffers prior to any subsequent depositions. Interestingly, we find that a combination of X-ray diffraction and Raman spectroscopy provided (see, Example 2b) a quick way to identify non-tetragonal distortions. If we use the (224) reciprocal space maps and assume a tetragonal distortion to deduce the strain, the value obtained from the X-ray analysis and from Raman spectroscopy agree within experimental error for perfectly tetragonal samples, but differ by factors as high as two if the sample distortion is of lower symmetry than tetragonal.

Figure 9:
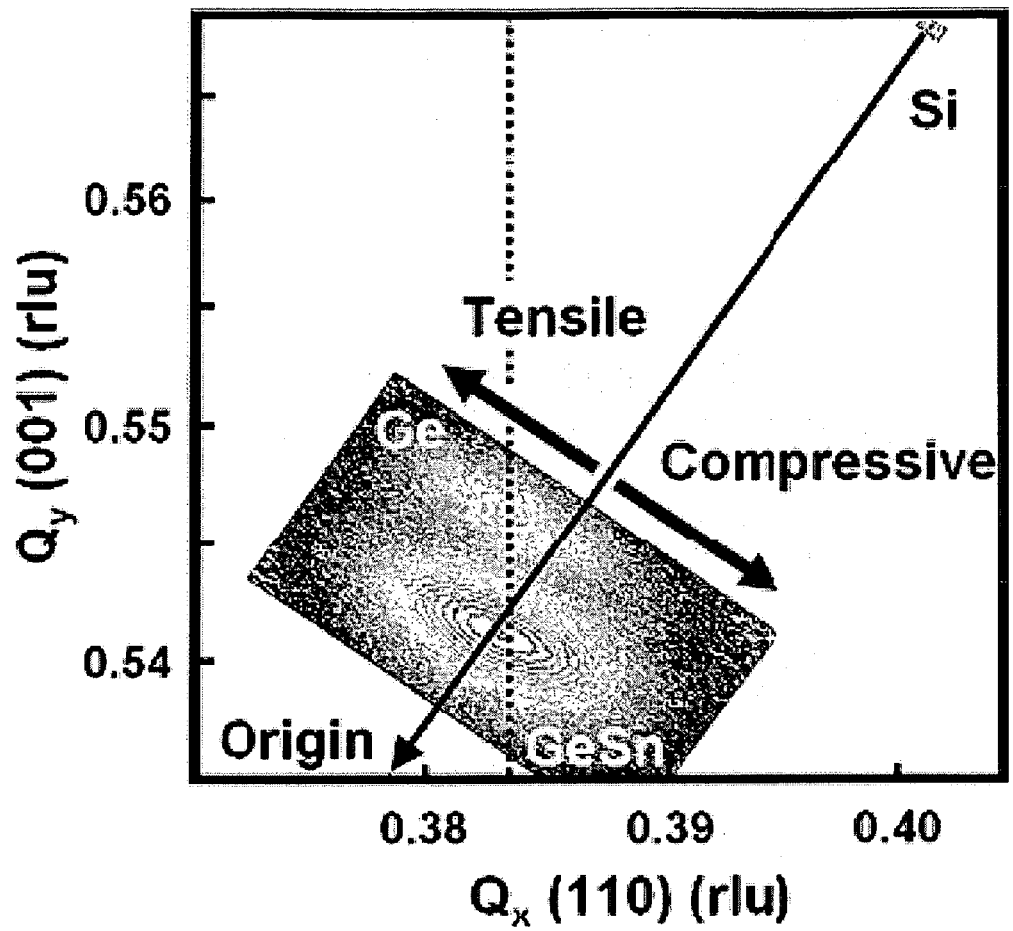
FIG. 9 is an XRD reciprocal space map of the (224) reflections, showing the Ge epilayer and the $Ge_{0.965}Sn_{0.035}$ buffer relative to the Si substrate peak for an embodiment of the invention. The Ge peak falls above the relaxation line connecting the Si peaks and the origin, indicating tensile strain of ~0.45%.
Figure 10:
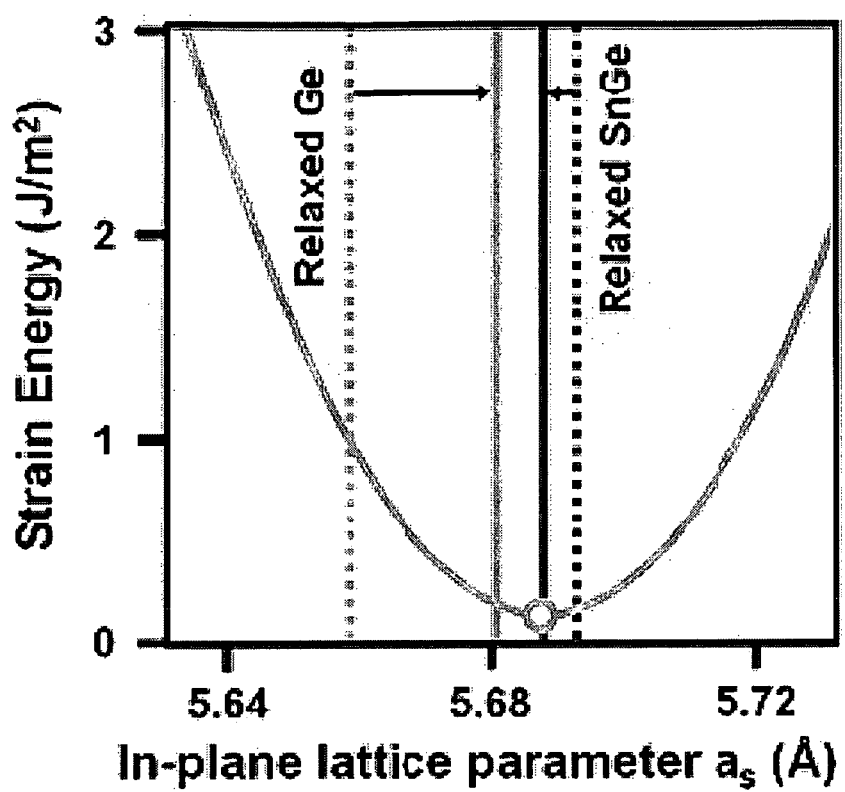
FIG. 10 is a strain equilibration in the $Ge/Ge_{0.965}Sn_{0.035}$ bilayer. The relaxed Ge and GeSn in-plane lattice parameters (dotted lines) are shifted (arrows) towards a common minimum (open circle) to minimize the combined strain energy. Note that the buffer layer is only slightly compressed.

FIG. 9 shows the (224) spectra of a representative sample with composition Ge/Ge$_{0.965}$Sn$_{0.035}$, and epilayer/buffer thicknesses of ~60/230 nm. The thicker Ge$_{0.965}$Sn$_{0.035}$ layer was also found to be essentially relaxed and nearly cubic ($a_{\parallel,GeSn}$=5.6872 Å, $a_{\perp,GeSn}$=5.6955 Å). This was further confirmed by the close proximity of the GeSn peak maximum to the relaxation line connecting the corresponding Si (224) peak to the origin of the plot. The plots also show a near perfect vertical alignment of the Ge and GeSn (224) peaks indicating a fully coherent stack as shown by the dotted line in FIG. 9. Note the considerable vertical offset of the Ge peak with respect to the relaxation line, indicating a significant tensile strain which is manifested as a tetragonal distortion that accommodates the large lattice mismatch with the buffer. The ideal strain equilibration behavior of the $_{Ge/Ge0.965}$Sn$_{0.035}$ sample is plotted in FIG. 10 which shows that most of the strain energy minimization is accounted for by the expansion of the Ge epilayer in the a-b plane. This indicates that for thick (>200 nm) buffers very little change in the dimensions of the buffer is expected.

To derive the precise values of the in-plane ($\epsilon_\parallel$) and perpendicular ($\epsilon_\perp$) strain values we conducted a quantitative analysis of the XRD data assuming that the epitaxial Ge films adopt a purely tetragonal distortion, relative to their unstrained cubic form, in which $\epsilon_\parallel=(a_\parallel-a_0)/a_0$ and $\epsilon_\perp=(a_\perp-a_0)/a_0$ (where $a_\parallel$, $a_\perp$ and $a_0$ are the measured in-plane, vertical and relaxed lattice constants). The two strains are related by $\epsilon_\perp=-2C_{12}/C_{1.1}\epsilon_\parallel$, which we can write $\epsilon_\perp=-\xi\epsilon_\parallel$, with $\xi=2C_{12}/C_{11}$ (where $C_{12}$ and $C_{11}$ are the elastic constants). The strain relation can be inverted to obtain the unstrained lattice constant $a_0=(a_\perp+\xi a_\parallel)/(1+\xi)$, the $\epsilon_\parallel=(a_\parallel-a_\perp)/(a_\perp+\xi a_\parallel)$ and the $\epsilon_\perp=\xi(a_\perp-a_\parallel)/(a_\perp+\xi a_\parallel)$ of the film. For the elastic constants we adopt the values $C_{11}$=128.5 GPa, $C_{12}$=48.3 GPa from Madelung (supra). while for strained Ge film we use $a_{\parallel,Ge}$=5.6802 Å and $a_{\perp,Ge}$=5.6416 Å obtained from XRD. These data yield parallel and perpendicular strain values of $\epsilon_\parallel$~+0.40% and $\epsilon_\perp$~−0.30%, and an unstrained Ge lattice constant of $a_0$=5.658 Å, in excellent agreement with the known bulk Ge value. Taking differentials of the strain relations above yields the following expression:

$$\frac{\delta\epsilon_\parallel}{\epsilon_\parallel} = \left(\frac{1}{1+a_\perp/\xi a_\parallel}\right)\frac{\delta\xi}{\xi} \approx \frac{1}{2}\frac{\delta\xi}{\xi} \quad (2)$$

Thus a fractional error in the elastic ratio $\epsilon=2C_{12}/C_{11}$ produces half this error in the in-plane strain. For instance, if $C_{11}$=129±3 GPa and $C_{12}$=48±3 GPa, (see, Madelung, supra), then $\xi$=0.75±0.07 (±9.3%) which implies a corresponding fractional error of only ~5% in the in-plane strain. So, for the Ge/Ge$_{0.965}$Sn$_{0.035}$ we obtain $\epsilon_\parallel$~−0.40±0.03%. The corresponding strain value obtained by Raman (see below) is $\epsilon_\parallel$~−0.43 well within the 0.03% error. This value represents the highest tensile strain observed in elemental Ge semiconductors to date.

Figure 11:
FIG. 11 is a diffraction contrast XTEM image of the $Ge/Ge_{0.965}Sn_{0.035}/Si($100$)$ heterostructure.
Figure 12:
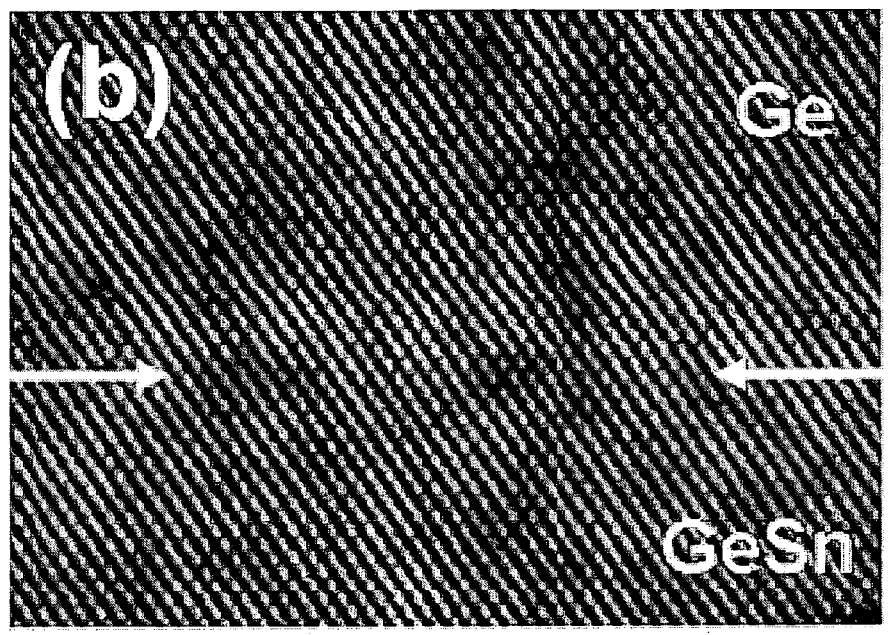
FIG. 12 is a high resolution XTEM micrograph of the corresponding interface of FIG. 11.
Figure 13:
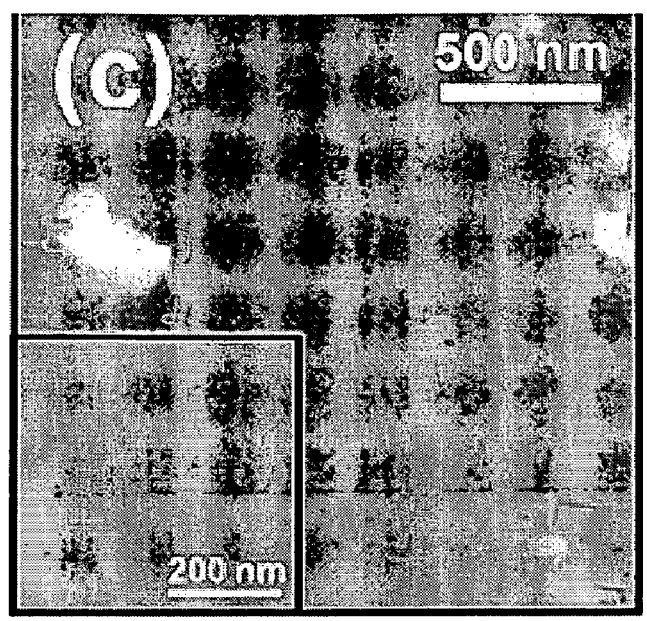
FIG. 13 is a 2×2 μm² AFM scan showing a smooth surface created by the coalescence of atomically flat terraces. Inset is a 0.5×0.5 μm² AFM scan with RMS roughness of 0.2 nm.

Extensive XRD studies of a wide range of tensile strained Ge films grown on Ge$_{1-y}$Sn$_y$, y=0.015–0.035) indicated strain states between 0.15–0.43%, respectively. The XTEM data of these samples revealed monocrystalline films possessing commensurate interfaces and atomically smooth surfaces regardless of the epilayer thickness. FIGS. 11 and 12 shows electron micrographs of the Ge/Ge$_{0.965}$Sn$_{0.035}$ sample indicating a 60 nm thick Ge layer grown epitaxially on a 230 nm thick Ge$_{1-y}$Sn$_y$ buffer. The bright field image shows essentially no penetrating threading defects over an extended lateral range of 1 µm and the high resolution micrograph near the Ge/Si interface reveals a sharp, commensurate transition between the epilayer and the buffer. AFM analysis of the sample shows that the surface is predominantly flat, with an RMS roughness of ~1.5 nm over a typical 5×5 µm² area [FIG. 13]. On a smaller 0.5×0.5 µm² scale we observe atomically smooth surfaces with a reduced RMS roughness of ~0.2 nm. The difference in these values is associated with the presence of tiny voids located at the intersection of individual coalescing terraces as described previously. In thicker films these terraces coalesce fully and such features are not longer visible. In contrast, the growth of pure Ge$_2$H$_6$ in the absence of the organic additive (GeH$_3$)$_2$CH$_2$ produces defective and rough films with classic island-like surface morphology consistent with a mismatched heteroepitaxy growth mode. This observation confirms the notion that the organic additives significantly alter the surface energetics, promoting organized assembly of planar Ge films at conditions that would normally preclude their growth directly on GeSn on the basis of surface energy differences. Note that analogous differences in surface energetics prevent the heteroepitaxial growth of silicon films directly on a Ge surface. However, as we have demonstrated above, the pseudosurfactant properties of the organic additives enable the remarkable and unconventional growth of fully strained and perfectly planar Si layers on Ge buffers.

In one example of Ge epilayer strain tuning via Sn content in the buffer, we conducted growth of Ge layers on buffers with smaller/larger lattice constants such as $Ge_{1-y}Sn_y$ with y=0.015–0.035. For samples with the similar Ge/GeSn film thickness ratio we find $\epsilon_\parallel$=0.17% for y=0.015 and $\epsilon_\parallel$=0.45% for y=0.035 (see, FIG. 3). Increasing y (within the 1.5-3.5% range) produces systematically larger strains in the Ge overlayers.

In summary, we have demonstrated the growth of tensile strained Ge films on $Ge_{1-y}Sn_y$/Si composite substrates. Our approach is straightforward and suitable for large-scale integration. Contrary to the thermal expansion processes, our growth proceeds at low temperatures (~380° C.) compatible with selective growth.

We claim:

1. A method for preparing a semiconductor structure, comprising:
   a) forming a $Ge_{1-y}Sn_y$ buffer layer on a semiconductor substrate;
   b) forming a tensile strained Ge layer on the $Ge_{1-y}Sn_y$ buffer layer using an admixture of $(GeH_3)_2CH_2$ and $Ge_2H_6$ in a ratio of between 1:10 and 1:30.

2. The method of claim 1, wherein the semiconductor substrate comprises silicon.

3. The method of claim 1, wherein y is between 0.015-0.045.

4. The method of claim 1, wherein the method comprises in situ thermal cycling at a temperature of between 500° C. and 600° C. or by rapid thermal annealing up to 850° C. following forming of the $Ge_{1-y}Sn_y$ buffer layer on a semiconductor substrate.

5. The method of claim 1, wherein forming the Ge layer is accomplished via gas source molecular beam epitaxy at between 300° C. to 420° C.

6. The method of claim 1, wherein the $Ge_{1-y}Sn_y$ buffer layer is at least 95% relaxed.

7. The method of claim 1, wherein the symmetry of the Ge layer is tetragonal.

8. The method of claim 1, wherein the Ge layer has a tunable tensile strain of between 0.15% and 0.45%.

9. The method of claim 1, wherein the admixture comprises $(GeH_3)_2CH_2$ and $Ge_2H_6$ in a ratio of between 1:15 and 1:25.

10. A semiconductor structure produced by the methods of claim 1.

11. A method for depositing a Ge layer on a $Ge_{1-y}Sn_y$ buffer layer in a reaction chamber, comprising
   introducing into the chamber a gaseous precursor comprising an admixture of $(GeH_3)_2CH_2$ and $Ge_2H_6$ in a ratio of between 1:10 and 1:30, under conditions whereby a layer comprising a Ge material is formed on the $Ge_{1-y}Sn_y$ buffer layer.

12. The method of claim 11, wherein the gaseous precursor are in substantially pure form.

13. The method of claim 11, wherein a single gas source comprises the gaseous precursors.

14. The method of claim 11, wherein the gaseous precursor are intermixed with an inert carrier gas.

15. The method of claim 14 wherein the inert carrier gas comprises $H_2$.

16. The method of claim 14 wherein the inert carrier gas comprises $N_2$.

17. The method of claim 11, wherein the gaseous precursor is deposited by gas source molecular beam epitaxy or low pressure CVD.

18. The method of claim 11, wherein the gaseous precursor is introduced at a temperature of between 350° C. and 380° C.

19. The method of claim 11, wherein the gaseous precursor is introduced at a partial pressure between $10^{-8}$ Torr and 1000 Torr.

20. The method of claim 11, wherein the Ge layer is formed on the $Ge_{1-y}Sn_y$ buffer layer as an atomically planar surface.

21. The method of claim 11, wherein an admixture of $(GeH_3)_2CH_2$ and $Ge_2H_6$ has a ratio of between 1:15 and 1:25.

* * * * *